United States Patent [19]

Häfele et al.

[11] Patent Number: 4,743,772

[45] Date of Patent: May 10, 1988

[54] METHOD FOR DETERMINING THE POSITION OF AN OBJECT IN AN AUTOMATED PRODUCTION PROCESS AND A DEVICE FOR CARRYING OUT THE METHOD

[75] Inventors: Eberhard Häfele, Rosenheim; Rüdiger Wilde, Munich, both of Fed. Rep. of Germany

[73] Assignee: Siemens Aktiengesellschaft, Berlin and Munich, Fed. Rep. of Germany

[21] Appl. No.: 833,620

[22] Filed: Feb. 26, 1986

[30] Foreign Application Priority Data

Feb. 28, 1985 [DE] Fed. Rep. of Germany ....... 3507116

[51] Int. Cl.⁴ .............................................. G01B 11/00
[52] U.S. Cl. .................................. 250/561; 250/222.1; 356/375
[58] Field of Search ................ 250/561, 222.1, 223 R, 250/560; 356/373, 375–376, 379, 383–384, 387; 414/627; 901/47

[56] References Cited

U.S. PATENT DOCUMENTS 3,527,953 9/1970 Chitayat ............................... 250/561
3,973,682 8/1976 Neff ..................................... 414/627
4,103,814 8/1978 Nishioka .
4,322,162 3/1982 McKelvie .
4,564,756 1/1986 Johnson ............................... 250/561
4,575,637 3/1986 Sullivan, Jr. ......................... 356/375

FOREIGN PATENT DOCUMENTS 0077878 5/1983 European Pat. Off. .

OTHER PUBLICATIONS

Patent Abstracts of Japan, vol. 8, No. 63, Mar. 24, 1983.

Primary Examiner—Edward P. Westin
Attorney, Agent, or Firm—Herbert L. Lerner; Laurence A. Greenberg

[57] ABSTRACT

A method for determining the position of an object located on a carrier relative to a normal position, in an automated production process includes reflecting a light beam off an object and its immediate surroundings, separating a ray path of rays reflected by the object from a ray path of remaining reflected rays with different reflection surfaces of the object and its immediate surroundings, passing on the ray path of the rays reflected by the object for evaluation, and determining the position of the object based on brightness contrast between the rays reflected by the object and by its immediate surroundings, and a device for carrying out the method.

6 Claims, 1 Drawing Sheet

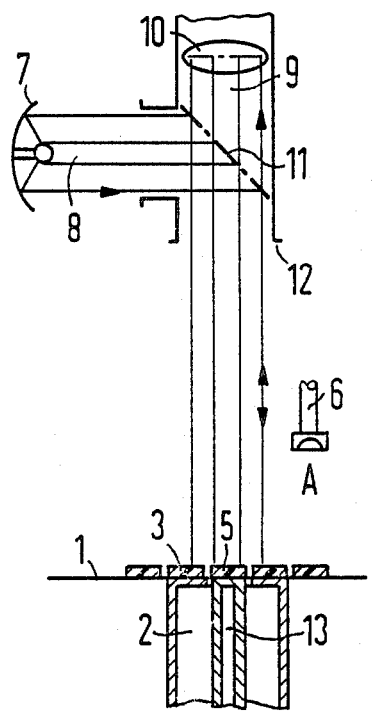
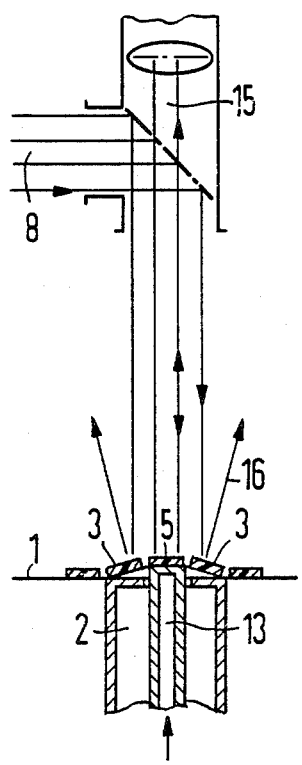
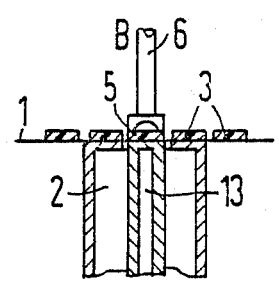
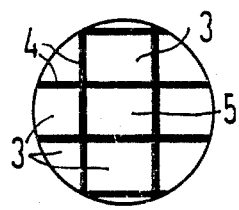
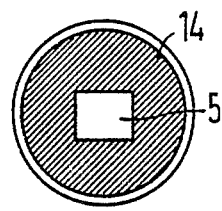

METHOD FOR DETERMINING THE POSITION OF AN OBJECT IN AN AUTOMATED PRODUCTION PROCESS AND A DEVICE FOR CARRYING OUT THE METHOD

The invention relates to a method for determining the position of an object relative to a normal position, in an automated production process, such as a semiconductor chip in a so-called bonding device, wherein the brightness contrast within a light beam reflected by the object and its immediate surroundings serves as a determining criterion. The invention also relates to a device for carrying out the method, including a light source for generating a focused light beam directed toward the object and its immediate surroundings, and a light receiver.

One production step necessary for the mass production of semiconductor components is removing the individual chips which have been sawed from a disc or wafer and placed on an elastic adhesion foil, and passing them on to further processing. For this purpose, the position of the respective chips must be determined and aligned relative to a pickup device, which may be a suction head.

The recognition systems used for this purpose utilize the brightness contrast between the saw track and the chip surface. In order to assure reliable distinction, the dark portion must have a given ratio to the bright portion, i.e., the saw track and the size of the chip must have a minimum ratio. This has been possible heretofore only by spreading the support foil as a function of the chip size.

During this process, the foil is pulled apart concentrically so that the distance from adjacent chips is increased accordingly. However, since uniform spreading of the foil is impossible in practice, position inaccuracies of the foil plane in the x and y-direction as well as angle changes can result. Furthermore, the wafer diameter can be subjected to an undefined change. Besides long adjustment times, this has the consequence of causing technical problems during further processing and decreases in quality due to the partially non-correctible deviations.

An example for a bonding device operating according to this method is described in German Published, Non-Prosecuted Application DE-OS No. 26 20 599. Another such device is known from European Patent EP No. B1-40 580.

It is accordingly an object of the invention to provide a method for determining the position of an object in an automated production process and a device for carrying out the method, which overcomes the hereinafore-mentioned disadvantages of the heretofore-known methods and devices of this general type, with an improved bright/dark contrast.

With the foregoing and other objects in view there is provided, in accordance with the invention, a method for determining the position of an object located on a carrier relative to a normal position, in an automated production process, such as a semiconductor chip on a bonding surface, which comprises reflecting a light beam off an object and its immediate surroundings, separating a ray path of rays reflected by the object from a ray path of remaining reflected rays with different reflection surfaces of the object and its immediate surroundings, passing on the ray path of the rays reflected by the object for evaluation, and determining the position of the object based on brightness contrast between the rays reflected by the object and by its immediate surroundings.

The invention is based on the fact that focused light which is directed toward the object and its environment is deflected differently if the object and its environment are deflected differently. Only one of the partial beams is fed to the optical evaluation system, so that a strong brightness contrast can be perceived.

In the special application of chip bonding, the invention has the advantage of retaining the original position of the chip on the foil, i.e., the x, y and $\phi$-parameters are preserved. Qualitative improvements are therefore achieved by increased position accuracy of the lifted chip, a shortening of the adjustment times as well as a savings of equipment and labor for spreading the foil. The stress of the foil carrier due to the deflection according to the invention is within the permissible elastic range.

In accordance with another mode of the invention, there is provided a method which comprises lifting the object into parallel planes and inclining the immediate surroundings thereof forming the different reflection surfaces.

With the objects of the invention in view there is also provided a device for determining the position of an object located on a carrier relative to a normal position, in an automated production process, such as a semiconductor chip on a bonding surface, comprising a light source for generating a focused light beam directed toward the object and its immediate surroundings, a light receiver having a given receiving range, a deflection device for deflecting the object relative to its immediate surroundings forming differently aligned reflection surfaces and causing a ray path of light reflected by the object to be directed into the light receiver and a ray path of remaining light to be directed outside said given receiving range of the receiver.

In accordance with a concomitant feature of the invention, the deflection device is a plunger-like body disposed below the carrier being movable perpendicular to the plane of the carrier.

Other features which are considered as characteristic for the invention are set forth in the appended claims.

Although the invention is illustrated and described herein as embodied in a method for determining the position of an object in an automated production process and a device for carrying out the method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIGS. 1, 3 and 5 are fragmentary, diagrammatic, cross-sectional views of a device according to the invention, as seen during different process steps of the method; and FIGS. 2 and 4 are reproductions of the brightness contrast seen during the steps according to FIGS. 1 and 3, respectively.

Referring now to the figures of the drawings in detail and first, particularly, to FIG. 1 thereof, there is seen an elastic carrier 1 with objects located thereon, which are semiconductor chips 3, 5 in the illustrated embodiment, and a mounting bed 2 below the carrier and the chips, as seen in a readiness phase. The carrier 1 is formed of a foil coated with adhesive. A wafer which is sawed into the individual chips 3, 5, sticks to the foil. The distances between the chips 3, 5 correspond to saw tracks 4 produced by the sawing, as seen in FIG. 2. The mounting bed 2 together with the carrier 1 can be moved in a plane in order to bring a chip 5 to be lifted into a position in which it is seized by a pickup, which may be constructed as a suction head 6, after which it is taken to further non-illustrated processing. The suction head 6 remains in a waiting position A, until the chip 5 is aligned in the desired position.

Below the mounting bed 2 is a deflection device, which has a function that will be described in detail in connection with FIG. 3.

A light source 7 directs a focused light beam 8 toward an area of the carrier 1 which, for practical reasons, includes the chip 5 and its environment, i.e., at least parts of the adjacent chips 3. A light beam 9 reflected by these objects is received by a light receiver 10.

In the preferred embodiment shown, the ray bundle of the light source 7 is directed by an inclined transparent divider mirror 11, behind which the light receiver 10 is disposed, so that it receives all of the rays of the light beam which are reflected perpendicularly relative to the elastic carrier 1. A mask 12 disposed in the reflected ray path prevents stray light from penetrating.

FIG. 2 diagrammatically illustrates the image of the surfaces of the chips 3, 5 and the saw tracks 4 that would be generated on an image producing device by the light receiver 10, which may be an optical device or an electronic camera. It can be clearly seen that only a very slight brightness contrast exists for the surface of chip 5 because of the relatively narrow saw tracks 4.

According to FIG. 3, the deflection device 13 acts on the chip 5 and the adjoining region of the carrier with the adjacent chips 3, in such a manner that the reflection surfaces are shifted from their original position. The chip 5 is shifted relative to the mounting bed 1 in a parallel plane. In the preferred embodiment, the deflection device 13 is in the form of a plunger which executes a lifting motion in the direction of the arrow below the device. However, in this case the chips 3 are only lifted on one side so that their surfaces form an inclined reflection surface. The incident light rays are therefore only reflected back to the light receiver 10 by the surface of the chip with a focus that is unchanged regarding their reflection angle, the ray path 15 being additionally limited by the mask. Since the surfaces of the adjacent chips 3 are now arranged at an angle relative to the surface of chip 5, the incident light rays are deflected and scattered in ray path 16 outside of the receiving range of the receiver 10.

According to the diagrammatic presentation of FIG. 4, a strong brightness contrast is thus noted on the display device: the angled-off chips 3 act as a dark surrounding field 14 relative to chip 5.

Due to this display, the carrier 1 together with the chip 5 can be aligned relative to a normal position which can be marked on the image reproduction device by cross lines, for instance, and in which the operating position B of the suction head 6 agrees with the position of the chip 5 in the desired manner. The suction head 6 is preferably placed on the chip 5 after the deflection device 13 is returned to the starting position, as shown in FIG. 5.

The foregoing is a description corresponding in substance to German Application P No. 35 07 116.8, filed Feb. 28, 1985, the International priority of which is being claimed for the instant application, and which is hereby made part of this application. Any material discrepancies between the foregoing specification and the aforementioned corresponding German application are to be resolved in favor of the latter.

We claim:

1. Method for determining the position of an object located on a carrier relative to a normal postion, in an automated production process, which comprises reflecting a light beam off an object and its immediate surroundings, separating a ray of light reflected by the object from remaining reflected rays of light reflected by the immediate surroundings by deflecting at least one of the object and its surroundings to provide reflection surfaces of the object and its immediate surroundings which differ from each other, passing on the ray of light reflected by the object for evaluation, and determining the position of the object based on brightness contrast between the rays of light reflected by the object and by its immediate surroundings.

2. Method according to claim 1, which comprises lifting the object into a plane parallel to the plane occupied by the carrier before lifting and inclining the immediate surroundings thereof forming the reflection surfaces which differ from each other.

3. Device for determining the position of an object located on a carrier relative to a normal position, in an automated production process, comprising a light source for generating a focused light beam directed toward the object and its immediate surroundings, a light receiver having a given receiving range, a deflection device for deflecting the object relative to its immediate surroundings forming differently aligned reflection surfaces and causing a ray of light reflected by the object to be directed into the light receiver and of remaining rays of light to be directed outside said given receiving range of the receiver.

4. Device according to claim 3, wherein said deflection device is in the form of a plunger disposed below the carrier being movable perpendicular to the plane of the carrier.

5. Method according to claim 1, which comprises generating the light beam from a light source, and placing the object between the light source and the carrier.

6. Device according to claim 3, wherein the object is disposed between said light source and the carrier.

* * * * *